(12) United States Patent
Hess et al.

(10) Patent No.: US 8,501,539 B2
(45) Date of Patent: Aug. 6, 2013

(54) SEMICONDUCTOR DEVICE PACKAGE

(75) Inventors: Kevin J. Hess, Round Rock, TX (US); Michael B. McShane, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 883 days.

(21) Appl. No.: 12/617,477

(22) Filed: Nov. 12, 2009

(65) Prior Publication Data

US 2011/0108965 A1 May 12, 2011

(51) Int. Cl.
*H01L 21/44* (2006.01)
*H01L 23/495* (2006.01)

(52) U.S. Cl.
USPC ............ 438/111; 438/112; 257/666; 257/676

(58) Field of Classification Search
USPC .......... 438/111, 112, 113, 123–127; 257/666, 257/670, 787
See application file for complete search history.

(56) References Cited

U.S. PATENT DOCUMENTS

| | | | |
|---|---|---|---|
| 4,920,074 A | 4/1990 | Shimizu et al. |
| 5,391,439 A | 2/1995 | Tomita et al. |
| 5,444,293 A | 8/1995 | Li |
| 5,519,251 A | 5/1996 | Sato et al. |
| 6,060,768 A | 5/2000 | Hayashida et al. |
| 6,201,292 B1 | 3/2001 | Yagi et al. |
| 6,238,952 B1 | 5/2001 | Lin |
| 6,261,864 B1 | 7/2001 | Jung et al. |
| 6,306,685 B1 | 10/2001 | Liu et al. |
| 6,333,252 B1 | 12/2001 | Jung et al. |
| 6,342,730 B1 | 1/2002 | Jung et al. |
| 6,400,004 B1 | 6/2002 | Fan et al. |
| 6,420,779 B1 | 7/2002 | Sharma et al. |
| 6,495,909 B2 | 12/2002 | Jung et al. |
| 6,528,893 B2 | 3/2003 | Jung et al. |
| 6,608,366 B1 | 8/2003 | Fogelson et al. |
| 6,700,188 B2 | 3/2004 | Lin |
| 6,723,585 B1 | 4/2004 | Tu et al. |
| 6,744,118 B2 | 6/2004 | Ikenaga et al. |
| 6,861,295 B2 | 3/2005 | Jung et al. |
| 6,872,599 B1 | 3/2005 | Li et al. |
| 7,023,074 B2 | 4/2006 | Li et al. |
| 7,033,866 B2 | 4/2006 | Chow et al. |
| 7,105,383 B2 | 9/2006 | Vo et al. |
| 7,183,630 B1 | 2/2007 | Fogelson et al. |
| 7,348,269 B2 | 3/2008 | Tanaka et al. |
| 7,382,045 B2 | 6/2008 | Osako et al. |
| 7,397,112 B2 * | 7/2008 | Sato et al. ...................... 257/666 |

(Continued)

FOREIGN PATENT DOCUMENTS

| | | |
|---|---|---|
| JP | 62-9639 | 1/1987 |
| JP | 2007-214185 | 8/2007 |
| WO | 2009/125250 A1 | 10/2009 |

*Primary Examiner* — Kevin M Picardat
(74) *Attorney, Agent, or Firm* — David G. Dolezal; Joanna G. Chiu (57) ABSTRACT

A method for forming a semiconductor device package includes providing a lead frame array having a plurality of leads. Each of the plurality of leads includes an opening extending through the lead from a first surface of the lead to a second surface of the lead, opposite the first surface, and each of the openings is at least partially filled with a solder wettable material. A plurality of semiconductor devices are attached to the lead frame array. The plurality of semiconductor devices are encapsulated, and, after encapsulating, the plurality of semiconductor devices are separated along separation lines which intersect the openings.

20 Claims, 6 Drawing Sheets

U.S. PATENT DOCUMENTS

| | | |
|---|---|---|
| 7,402,459 B2 | 7/2008 | Xiaochun et al. |
| 7,405,104 B2 | 7/2008 | Minamio et al. |
| 7,405,106 B2 | 7/2008 | Maloney et al. |
| 7,405,945 B2 | 7/2008 | Miura |
| 7,413,934 B2 | 8/2008 | Tellkamp |
| 7,423,337 B1 | 9/2008 | Patwardhan et al. |
| 7,456,049 B2 | 11/2008 | Miyata |
| 7,458,054 B2 | 11/2008 | Hara |
| 7,462,870 B2 | 12/2008 | Nakashima |
| 7,489,026 B2 | 2/2009 | Wang et al. |
| 2005/0067676 A1 | 3/2005 | Mahadevan et al. |
| 2005/0116321 A1* | 6/2005 | Li et al. .................. 257/666 |

* cited by examiner

SEMICONDUCTOR DEVICE PACKAGE

BACKGROUND OF THE INVENTION

1. Field of the Invention

This invention relates in general to semiconductor device packages and more specifically to improvements in leads of semiconductor device packages.

2. Description of the Related Art

Semiconductor device packages utilize leads for externally providing and receiving signals and power. One type of semiconductor device package is a flat no lead package where the leads are exposed at the bottom major side and a side of the package. With some flat no lead packages, the encapsulant and leads are cut during singulation of the packages. However, cutting the leads during the singulation exposes unplated metal surfaces of the leads that may oxidize between manufacture and attachment to a system board. Such oxidation may inhibit soldering.

What is needed is improved leads for a semiconductor device package.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As set forth herein, a semiconductor device package is manufactured to include a leads with through hole openings and solder wettable material in the openings. The leads can be singulated along lines that intersect the openings. Singulation exposes the solder wettable material in the openings.

Figure 1:
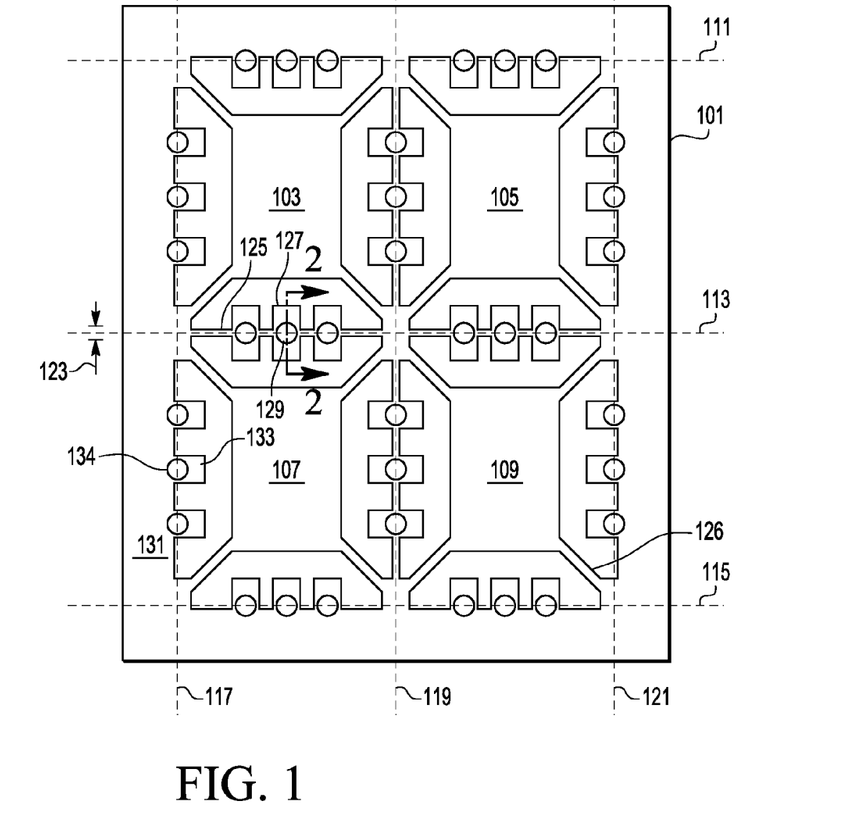
FIGS. 1-6 set forth views of various stages in the manufacture and installation of a semiconductor device package according to one embodiment of the present invention.

FIG. 1 is a top view of a lead frame array 101 for four flat no lead packages. Lead frame array 101 is formed from a sheet of metal (e.g. copper, copper alloy, or other conductive lead frame material). In one embodiment, lead frame array 101 has a thickness in the range of 125 to 200 microns, but may have other thicknesses in other embodiments. In one embodiment, openings in lead frame array 101 are formed to define various structures of the lead frame array such as flag areas 103, 105, 107, and 109, tie bars (126), lead supports (125), interior lead portions (127), and edge lead portions (133). In some embodiments, the openings are formed by stamping or etching. In some embodiments, some openings may be formed by stamping and others may be formed by etching.

Semiconductor chips (which include integrated circuits or other types of semiconductor devices) will be subsequently attached to the flag areas (103, 105, 107, and 109). The tie bars (126) connect the flag areas to the edge portions 131 of the lead frame array 101. Lead supports (125) connect the lead portions to edge portions 131 of lead frame array 101.

In the embodiment shown, four semiconductor device packages will be formed from lead frame array 101. However, a different number of packages may be formed from a lead frame array in different embodiments. In the embodiment shown, each package subsequently formed has three leads per side. However, in other embodiments, each package may include a different number of leads per side. Also, in some embodiments, some sides of a package would not have leads. Also in other embodiments, some packages may include multiple flags or multiple semiconductor devices may be attached to a flag such that a package includes multiple semiconductor devices. Still in other embodiments, some packages may support an attached semiconductor device on the end portions or middle portions of leads extending from the edge areas.

Interior lead portions (e.g. 127) include portions that will be the leads for two packages when separated. For example portion 127 includes one portion that will be a lead for a package of flag area 103 and another portion that will be a lead for a package of flag area 107.

After encapsulation, the lead frame array will be singulated along cut lines whose centers are shown by dashed lines 111, 113, 115, 117, 119, and 121. In one embodiment, singulation is performed by a saw or laser having a kerf width 123. In one embodiment, the kerf width is in the range of 100 to 300 microns, but may have other widths in other embodiments. In the embodiment shown, the kerf width 123 has a greater width than lead support 125 connecting the interior lead portions (127) to the edge portion 131 of lead frame array 101, and the through hole openings (129, 134) have a greater width than kerf width 123. Edge portion 131 is not included in the package areas.

In the embodiment shown, the lead portions (e.g. 127 and 133) include through hole openings (e.g. 129 and 134, respectively). The through hole openings extend from the topside of lead frame array 101 to the backside of lead frame array 101. These through hole openings will be subsequently filled (or at least partially filled) with a solder wettable material before encapsulation.

Figure 2:
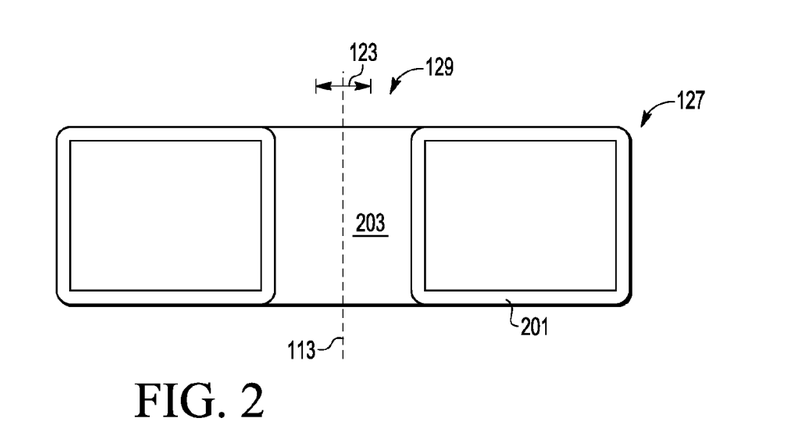

FIG. 2 shows a side cross-section view of interior lead portion 127 after lead frame array 101 has been plated and the through hole openings (e.g. 129 and 134) of the edge lead portions and the interior lead portions of lead frame array 101 have been filled with a solder wettable material. In one embodiment, Lead frame array 101 is plated with a plating material such as e.g. nickel palladium gold, tin, palladium, solder, other plating materials, or combinations thereof. In one embodiment, plating 201 has a thickness of 2 to 8 microns but may have other thicknesses in other embodiments. Plating can be performed either by electrolytic plating, electroless plating, or other plating processes. In the embodiment shown in FIG. 2, both major sides (top and bottom relative to the view shown in FIG. 2) and the interior walls of the through hole openings are plated. However, in other embodiments, a lead frame may be plated by only one side of the lead frame array or other portion of the lead frame array being plated. See the embodiments of FIGS. 8 and 11.

After the plating, the through hole openings are filled with a solder wettable material (203) such as e.g. tin, bismuth, indium, gold, silver, solder, another solder wettable material, or combinations thereof. In one embodiment, the solder includes an alloy of tin and lead but may include other solder materials in other embodiments.

The openings may be filled with a solder wettable material in a number of ways. In one embodiment, a ball of a solder wettable material which is slightly larger than the diameter of the through hole opening is placed on the opening on one side of the lead frame array. The ball is then melted or reflowed to fill the opening. In another embodiment, a solder wettable material wire is inserted into an opening and the wire is cut at the surface of the lead frame array followed by a reflow of the solder wettable material. In another embodiment, the lead frame array would be masked such that only the through hole openings of the lead frame array are exposed, wherein the solder wettable material is formed in the openings of the mask. In another embodiment, the through hole openings of the lead frame array would be filled with solder wettable material by a jetting process. In other embodiments, a lead frame array would be plated with a solder wettable material until the openings become blocked.

In other embodiments, a mask would be formed over the lead frame array with openings in the mask corresponding to desired locations of the through hole openings of the lead frame array. The through hole openings would be formed by etching the lead frame array material. The openings would then be plated with a plating material and afterwards filled with a solder wettable material prior to removal of the mask.

As shown in FIG. 2, the kerf width 123 is less than the diameter of through hole opening 129.

Figure 3:
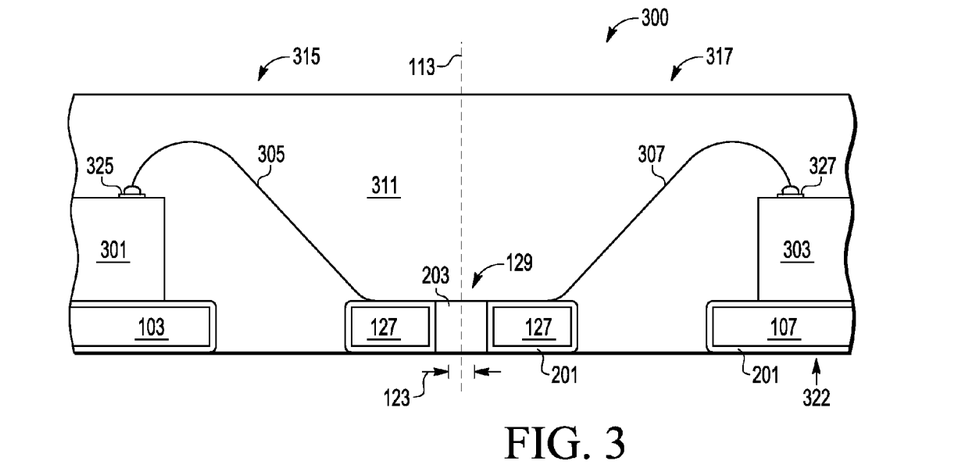

FIG. 3 is a partial cross-section view of lead frame array 101 after semiconductor chips 301 and 303 have been attached to flag areas 103 and 107, respectively, and the pads (e.g. 325, 327) of the chips are wire bonded to the lead portions (127) of the lead frame array by wires 305 and 307, respectively. FIG. 3 also shows a partial view after the lead frame array, semiconductor chips, and wire bonds are encapsulated with an encapsulant 311. Chips 301 and 303 can be attached to the lead frame array with either a conductive or non-conductive material. In one embodiment, chips 301 and 303 are formed from processed wafers of semiconductor material.

In the embodiment shown, pads 325 and 327 of the chips are wire bonded to portions of lead portion 127 e.g. by thermal sonic wire bonding, stitch bonding, or other types of wire bonding. However in other embodiments, the pads of chips 301 and 303 may be electrically coupled to the lead portions by other structures or methods. For example, chips 301 and 303 may have a flip chip configuration where the bond pads contact the lead portions of a lead frame array.

In one embodiment, encapsulant 311 is a molding compound (e.g. a plastic or epoxy resin) or other type of encapsulant that is flowed over a lead frame array and subsequently cured. However, the encapsulant may be applied by other methods in other embodiments. In the embodiment shown, portions of package 315 and package 317 are shown. In the embodiment shown, the plated bottom side 322 of lead frame array 101, including the plated bottom side of the flag areas is exposed from the encapsulant.

In the embodiment shown in FIG. 3, the encapsulant continuously covers all of the semiconductors chips. However, in other embodiments, the chips may be encapsulated by a discontinuous encapsulant. Encapsulated by a discontinuous encapsulant means that the encapsulating material is not continuous across the lead frame array but instead is formed at separate locations e.g. by a mold or form that isolates the encapsulant to the different package locations of a lead frame array.

Figure 13:
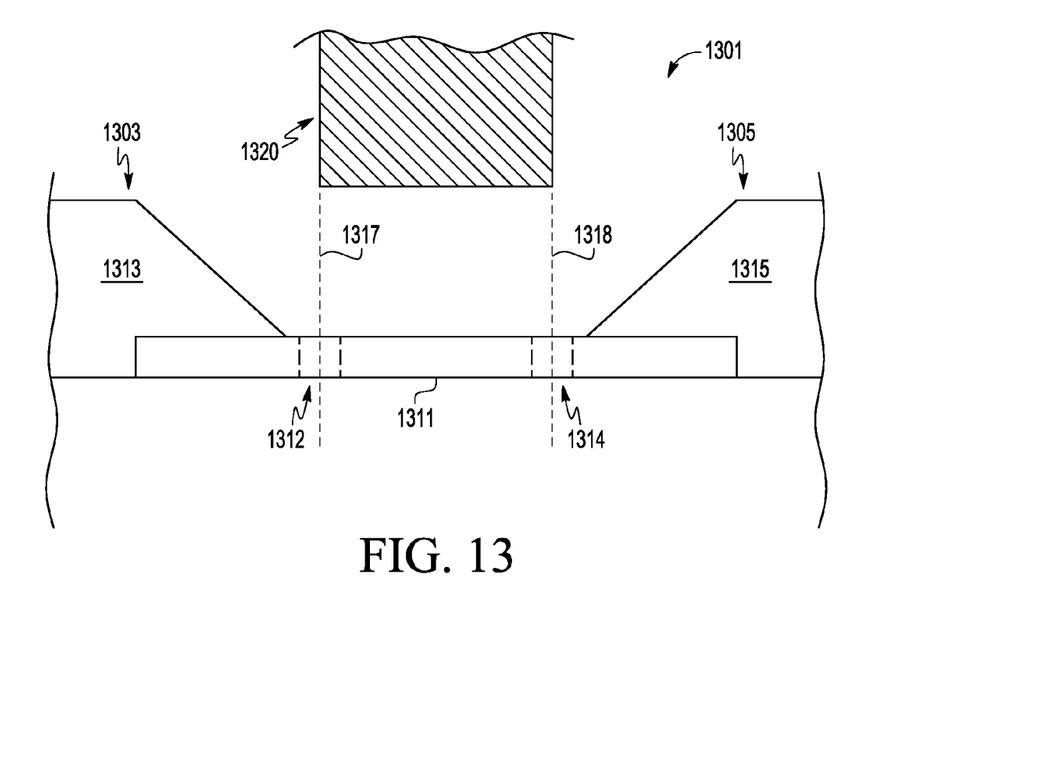
FIG. 13 sets forth a cutaway side view of a stage in the manufacture of a semiconductor device package according to another embodiment of the present invention.

For example, FIG. 13 is a partial cross-section view of two packages 1303 and 1305 formed from a lead frame array prior to singulation. Each package is attached to lead frame portion 1311. Lead frame portion 1311 has through hole openings 1312 and 1314 in the lead frame array. Cut lines 1317 and 1318 bisect openings 1312 and 1314, respectively. In the embodiment shown, the lead frame array is singulated by a punch tool 1320 that cuts the lead frame portion 1311 and solder wettable material that fills the through hole openings 1312 and 1314 along the cut lines 1317 and 1318. The lead frame array is encapsulated by a discontinuous encapsulant in that encapsulant 1313 and 1315 are formed separated such as e.g. by individual mold cavities. In another embodiment, the leads may be shaped and formed after singulation.

Referring back to FIG. 3, during encapsulation, the solder wettable material 203 blocks opening 129 such that the encapsulant does not fully fill the opening. If material 203 did not block opening 129, then encapsulant may flow into the bottom of opening 129. Such encapsulant would make subsequent soldering more difficult. By using a solder wettable material to block an opening instead of another type of blocking material, there does not have to be additional step of removing the other type of blocking material from the openings of the lead frame prior to soldering the package to a system board.

In subsequent processes, the resultant encapsulated structure is singulated along the cut lines including line 113 to separate the packages from each other. During the singulation, the material in kerf width 123 is removed as part of the singulation.

Figure 4:
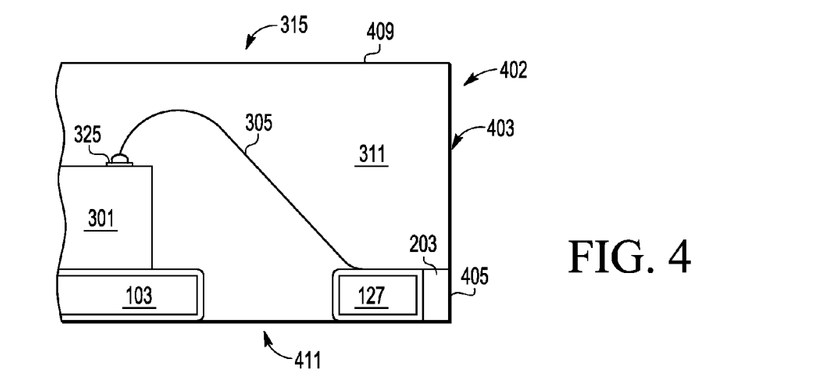

FIG. 4 is a partial cross-section view of package 315 after the encapsulated structure has been singulated. Package 315 includes a side 402 that was formed by cutting along line 113. Side 402 includes a side 403 of encapsulant 311 that is flush with a side 405 of solder wettable material 203. In the embodiment shown, top side 409 and bottom side 411 are major sides of package 315.

Figure 5:
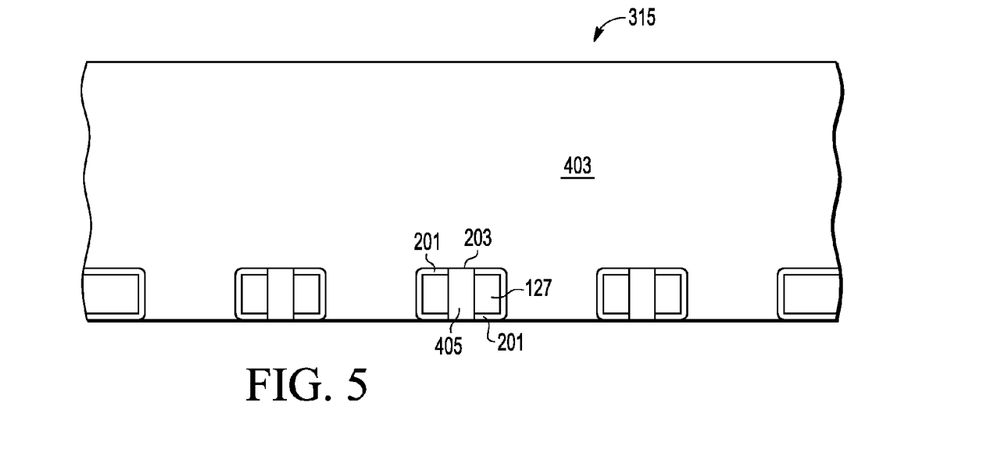

FIG. 5 is a side view of package 315 after singulation with side 402 facing outward. Side 403 of encapsulant 311 is flush with a side 405 of solder wettable material 203, as well as a side of lead portion 127 (and a portion of the plating 201). In the embodiment shown, the exposed portion of lead portion 127 is a surface that is readily oxidized and therefore may not be solder wettable if sufficient oxidation has occurred. However, because opening 129 is filled with a solder wettable material, the portion of lead portion 127 that forms the interior wall of opening 129 is not exposed during singulation and is not oxidized (due to the solder wettable material). Hence, it will allow for the formation of a solder joint with higher strength, increased reliability, and a longer operational life.

Figure 6:
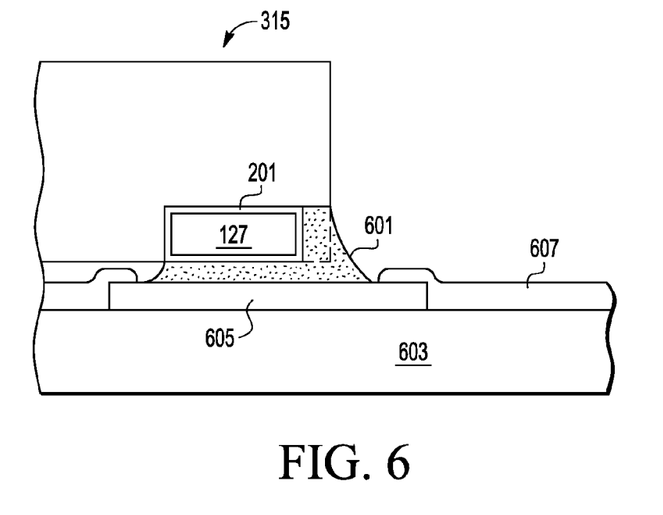

FIG. 6 shows a partial cross-section view of package 315 after it has been attached to a system board 603. Lead portion 127 is electrically coupled to trace 605 of system board 603 by solder 601. In one embodiment, solder 601 is of the same solder material as portion 203, but may be of a different material in other embodiments. In one embodiment, the solder is screen printed on the traces (605) of system board 603. Package 315 is placed on system board 603 and locally heated where the solder reflows on wettable surfaces such as the plated portions of lead portion 127 and hole 129. A solder mask 607 is used to control the spreading of solder during reflow. Because lead portion 127 includes wettable surfaces on the side of the lead where opening 129 was formed, a better solder connection between the lead and trace 605 can be made in that solder attaches to both the bottom and sides of the lead. Also, because a through hole opening extends from one side of a lead portion to an opposite side, the solder wettable surface has a larger total area than if the opening would not extend all of the way through the lead portion.

In the embodiment of FIG. 1-6, the plating is performed before the through hole openings are filled with a solder wettable material. However in other embodiments, plating may be performed at different times in the process.

Figure 7:
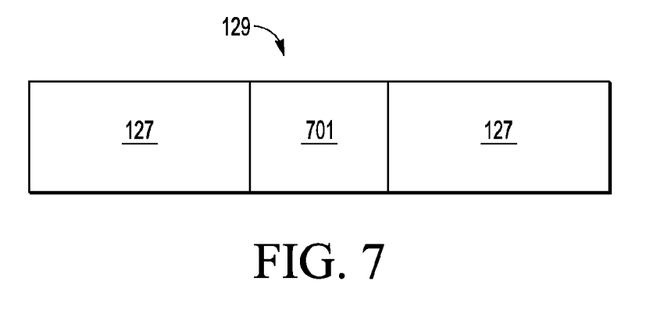
FIGS. 7-8 set forth views of various stages in the manufacture of a semiconductor device package according to another embodiment of the present invention.
Figure 8:
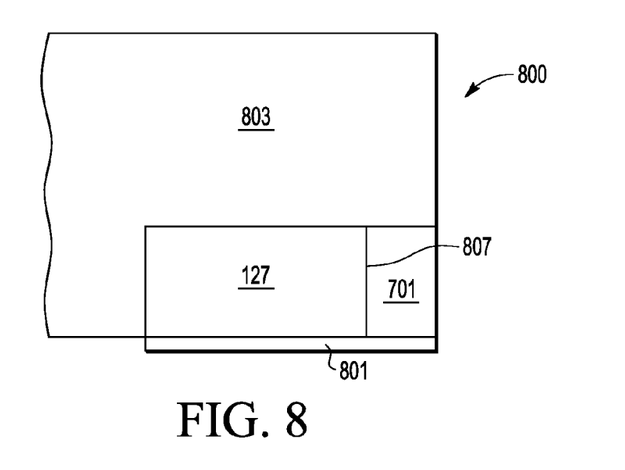

For example, FIGS. 7 and 8 illustrate an embodiment where the plating is applied after encapsulation. FIG. 7 shows a cross-section view of another embodiment of lead portion 127 of lead frame array 101 where the solder wettable material 701 is deposited in opening 129 before the plating of the lead frame array. After filling the through hole openings of the lead portions as shown in FIG. 7, semiconductor devices are attached to lead frame array 101. The bond pads of the semiconductor devices are electrically coupled to the lead portions (e.g. by wire bonding). Afterwards, the lead frame array structure (with the wire bonded devices) is encapsulated. After encapsulation, the exposed portions of lead frame array are plated followed by singulation. FIG. 8 shows a portion of a package 800 after singulation of the encapsulated lead frame array. As shown in FIG. 8, solder wettable material 701 protects the interior wall 807 that defines opening 129 in lead portion 127 from oxidizing. Plating after the encapsulation results in plating 801 providing additional spacing between the package 800 and the system board when the package is attached.

In one embodiment the solder wettable material 701 is the same material as the solder used to attach the package 800 to the system board. During solder reflow, the solder wettable material and the solder on the system board trace flow together. The end portion of the plating 801 is then embedded in the reflowed solder and provides for additional mechanical support of the lead after soldering.

Figure 9:
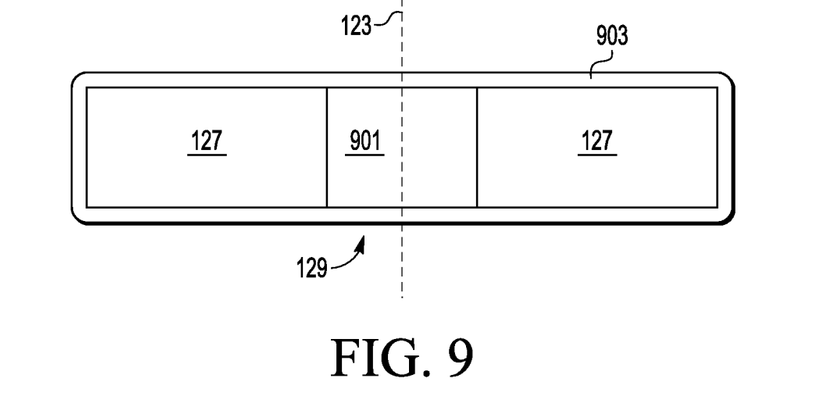
FIG. 9 sets forth a view of a stage in the manufacture of a semiconductor device package according to another embodiment of the present invention.

FIG. 9 shows a cross-section view of a lead frame portion illustrating another embodiment. In this embodiment, the through hole openings (129) are filled with a solder wettable material 901 and then the lead frame array is plated with a plating material 903. In this embodiment, the plating is also formed over the solder wettable material. Afterwards, the chips are attach and electrically coupled to the lead frame array (e.g. by wire bonding) followed by encapsulation. As with the embodiment of FIG. 8, the solder wettable material 901 protects the lead portion interior walls of opening 129 from oxidation prior to soldering on a system board.

Figure 10:
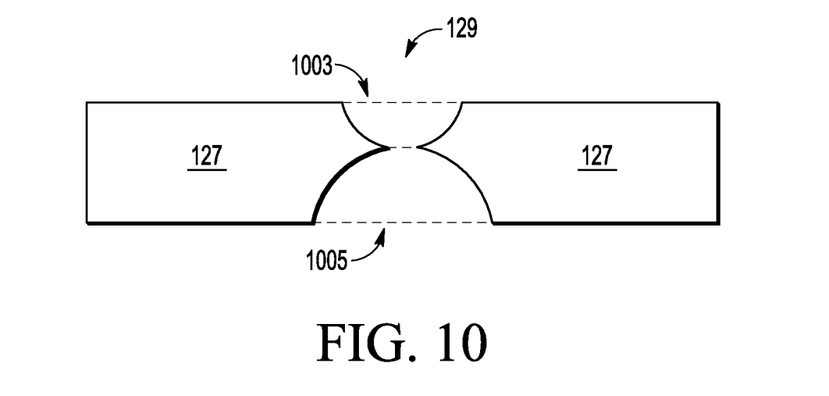
FIGS. 10 and 11 set forth views of various stages in the manufacture of a semiconductor device package according to another embodiment of the present invention.

FIG. 10 is a cross-section view of another embodiment of a lead portion according to the present invention. In FIG. 10, opening 129 includes two parts, opening part 1003 and opening part 1005. Each part is formed by etching the lead frame array from a particular major side. Part 1003 is formed by etching the lead frame array from the top, and part 1005 is formed by etching the lead frame array from the bottom (relative to the view shown in FIG. 10). As shown in FIG. 10, bottom part 1005 is bigger than top part 1003 in that it was etched for a longer period of time. In one embodiment, the lead frame array is made of copper and is etched with an etchant of aqueous ferric chloride. Other etchants may be used, such as aqueous hydrogen peroxide mixed with hydrochloric acid.

Figure 11:
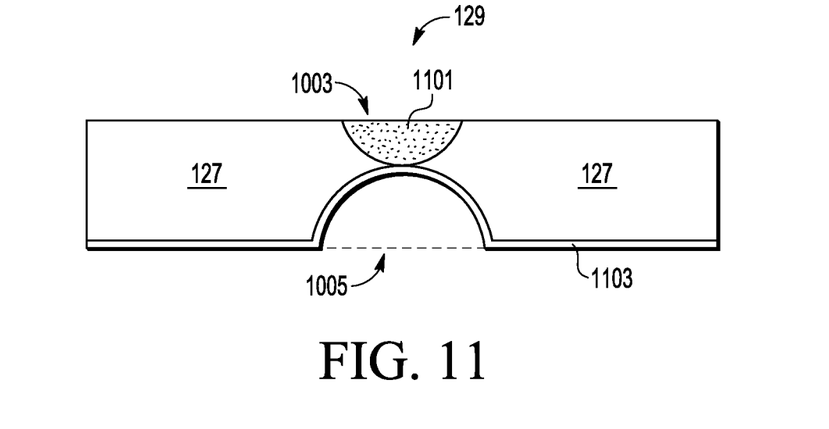

FIG. 11 shows a cross-section view of lead portion 127 (of the embodiment of FIG. 10) wherein top part 1003 of opening 129 is filled with a solder wettable material 1101. In the embodiment shown, opening 129 is only partially filled but material 1101 blocks the opening. Thus during subsequent encapsulation, the encapsulant material is prevented from flowing into the bottom part 1005 of opening 129. Because the part of opening between part 1003 and part 1005 is narrow, the surface tension of the solder wettable material holds the solder wettable material at the top portion during filling. After filling with a solder wettable material 1101, the bottom side of lead frame array 101 is plated with a plating material 1103. However, in other embodiments, the lead frame array may be plated on both sides or plated on only portions of the lead frame array.

Figure 12:
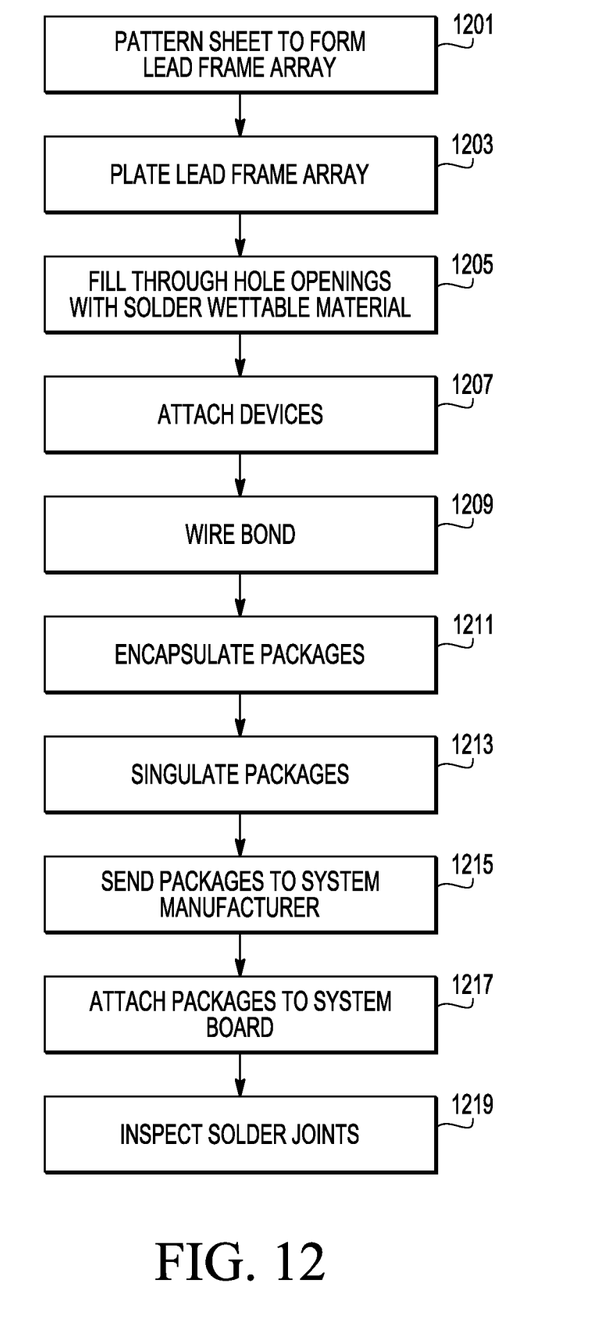
FIG. 12 is a flow diagram setting forth various stages in the manufacture and installation of a semiconductor device package according to one embodiment of the present invention.

FIG. 12 sets forth a flow diagram for the manufacture and installation of a semiconductor device package according to one embodiment of the present invention. In operation 1201, a sheet of lead frame material is patterned (e.g. by etching and/or stamping) to form a lead frame array (101). See FIG. 1. The patterning forms through hole openings (e.g. 129) in the lead portions (127) of the array. In operation 1203, the lead frame array is plated by a plating material (201), and in operation 1205, the though hole openings (129, 134) are filled with a solder wettable material 203. See FIG. 2.

In operation 1207, the semiconductor devices (e.g. 301) are attached to the lead frame array. In operation 1209, the bond pads of the semiconductor devices are wire bonded to the lead frame array. In operation 1211 the lead frame array and semiconductor devices are encapsulated to form unsingulated packages. See FIG. 3. In operation 1213, the encapsulated lead frame is singulated to separate the packages. See FIG. 4.

In operation 1215, the packages are sent to system manufacturers. In some embodiments, the packages may be shipped to different countries. Still in other embodiments, the packages may sit in inventory for weeks or months. Because, the interior walls of the holes of the leads are adjacent to a solder wettable material (e.g. 203), those lead surfaces do not oxidize and remain solder wettable even in non environmentally controlled warehouse conditions. Furthermore, because wettable material fills the holes and is flush with the cut surface of the lead (see FIG. 5 showing how side 405 is flush with the exposed side of lead portion (127), dirt, debris, or other contaminants do not accumulate in the portion of the through hole opening 129 of the singulated lead portion 127. Referring to FIG. 5, if material 203 is not located in lead portion 127, then a notch or recess in lead portion 127 (from the remaining portion of opening 129) may accumulate dirt or debris during storage or shipment. Such accumulation may present problems during soldering or require additional cleaning steps.

In operation 1217, the package is attached to a system board (e.g. 603). During attachment, solder wettable material (203) located in the openings of each lead reflow with the solder paste deposited on the system board to provide a solder joint that electrically couples the lead to that system board pad (605). See FIG. 6.

In operation 1219, the solder joint is inspected to ensure reliability. In one embodiment, the inspection is performed by an automated optical inspection system that utilizes x-rays to determine if there is an open solder joint. Because lead portions 127 include openings whose vertical sidewalls are protected from oxidation, the solder joint is also formed on those vertical sidewalls. A solder joint forming on a vertical side wall can be inspected by an x-ray machine from the top down. If the solder joint was only formed on the bottom of a lead, then the joint could not be inspected from the top with an automated optical inspection system. Also, forming a solder joint on the side as well as the bottom of a lead provides for a more reliable joint in that the joint forms on two surfaces perpendicular to each other instead of one. The soldered vertical surface and increased wetted area the two-sided solder joint improve resistance to lateral forces after board attach.

In other embodiments, the plating operation 1203 and through hole opening fill operation 1205 may be performed at different times in the process. For example, plating can be performed after operation 1205 or after operation 1211. In addition, only one side of a lead frame array may be plated.

Figure 14:
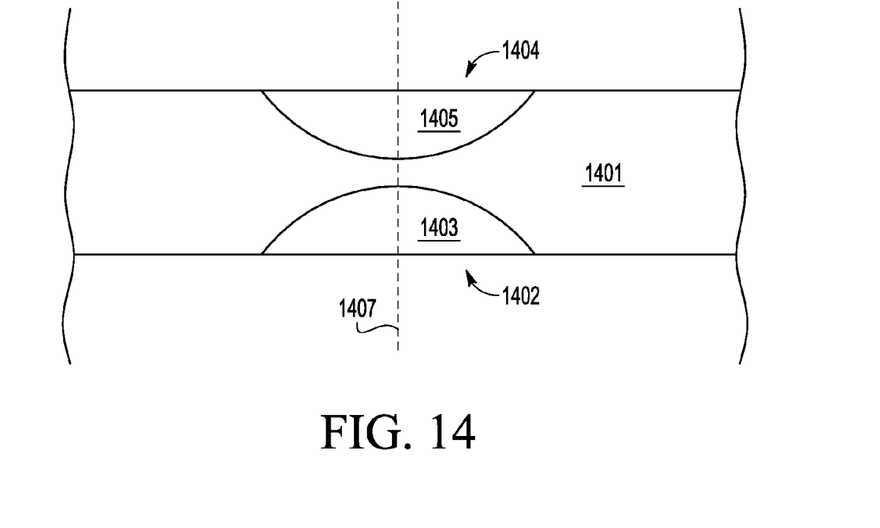
FIG. 14 shows a top view of a lead portion according to another embodiment of the present invention.

As shown in the previous Figures, the through hole openings (e.g. 129) are completely surrounded by lead frame material before singulation. However, in other embodiments, the through hole openings are not completely surrounded by lead frame material. For example, FIG. 14 is a top view of a lead portion 1401. Lead portion 1401 includes through hole openings 1402 and 1404 that extend from the top of lead portion 1401 to the bottom side of lead portion 1401 (the side facing away in FIG. 14). Located in through hole openings 1402 and 1404 are solder wettable material 1403 and 1405 respectively. FIG. 14 also shows cutline 1407 in which lead portion 1401 will be subsequently separated.

The through hole openings in the embodiments of FIGS. 1-13 are shown with a circular shape. However, the through hole openings in other embodiments may have other shapes e.g. such as oblong, oval, square, or rectangular.

Although a no lead package has been described herein, aspects disclosed in this application may be utilized with other types of packages such as leaded packages.

In one embodiment, a method for forming a semiconductor device package includes providing a lead frame array having a plurality of leads. Each of the plurality of leads includes an opening extending through the lead from a first surface of the lead to a second surface of the lead, opposite the first surface, and wherein each of the openings is at least partially filled with a solder wettable material. The method includes attaching a plurality of semiconductor devices to the lead frame array, encapsulating the plurality of semiconductor devices and at least a portion of the lead frame array, and after the encapsulating, separating the plurality of semiconductor devices along separation lines which intersect the openings.

In another embodiment, a method for forming a semiconductor device package includes providing a lead frame array having a plurality of leads. Each of the plurality of leads includes an opening extending through the lead from a first surface of the lead to a second surface of the lead, opposite the first surface. The method includes at least partially filling each of the openings with a solder wettable material. The at least partially filling each of the openings blocks each of the openings with the solder wettable material. The method also includes attaching a plurality of semiconductor devices to the lead frame array. Each semiconductor device is attached to a corresponding die flag of the lead frame array. The method further includes plating the lead frame array, encapsulating the plurality of semiconductor devices, and after the encapsulating, separating the plurality of semiconductor devices along separation lines which intersect the openings.

In another embodiments, a semiconductor device package includes a semiconductor die, a lead electrically coupled to the semiconductor die, and an encapsulant over the semiconductor die and the lead. The lead has a first surface exposed on a major surface of the encapsulant and a second surface exposed on a side surface of the encapsulant. The second surface is flush with at least a portion of the side surface. The at least a portion of the side surface is perpendicular to the major surface. The lead comprises an opening that opens towards the second surface of the lead and the opening includes solder. Therein the solder has a surface flush with the second surface of the lead.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a semiconductor device package, the method comprising:
   providing a lead frame array having a plurality of leads, wherein each of the plurality of leads includes an opening extending through the lead from a first surface of the lead to a second surface of the lead, opposite the first surface, and wherein each of the openings is at least partially filled with a solder wettable material;
   attaching a plurality of semiconductor devices to the lead frame array;
   encapsulating the plurality of semiconductor devices and at least a portion of the lead frame array, wherein the opening of each of the plurality of leads is blocked with the solder wettable material during the encapsulating; and
   after the encapsulating, separating the plurality of semiconductor devices along separation lines which intersect the openings.

2. The method of claim 1, wherein the providing the lead frame array is further characterized by the lead frame array being plated prior to the openings being at least partially filled with the solder wettable material.

3. The method of claim 1, wherein the providing the lead frame array is further characterized by the lead frame array being plated after the openings are at least partially filled with the solder wettable material.

4. The method of claim 1, wherein the encapsulating the plurality of semiconductor devices comprises encapsulating the plurality of devices with a continuous encapsulant that covers all of the plurality of devices.

5. The method of claim 1, wherein the encapsulating the plurality of semiconductor devices comprises encapsulating the plurality of devices with a discontinuous encapsulant.

6. The method of claim 1, wherein the attaching the plurality of semiconductor devices comprises electrically coupling the plurality of semiconductor devices and corresponding leads of the lead frame array.

7. The method of claim 1, wherein the providing the lead frame array is further characterized in that, for each of the openings, the solder wettable material that at least partially fills the opening, blocks the opening.

8. The method of claim 1, wherein the providing the lead frame array is further characterized in that each of the openings is completely surrounded by lead frame material.

9. A method for forming a semiconductor device package, the method comprising:
   providing a lead frame array having a plurality of leads, wherein each of the plurality of leads includes an opening extending through the lead from a first surface of the lead to a second surface of the lead, opposite the first surface;
   at least partially filling each of the openings with a solder wettable material, wherein the at least partially filling each of the openings blocks each of the openings with the solder wettable material;

attaching a plurality of semiconductor devices to the lead frame array, wherein each semiconductor device is attached to a corresponding die flag of the lead frame array;

plating the lead frame array;

encapsulating the plurality of semiconductor devices wherein the opening of each of the plurality of leads is blocked with the solder wettable material during the encapsulating; and after the encapsulating, separating the plurality of semiconductor devices along separation lines which intersect the openings.

10. The method of claim 9, wherein the plating is performed prior to the at least partially filling each of the openings with the solder wettable material.

11. The method of claim 9, wherein the plating is performed after the at least partially filling each of the openings with the solder wettable material and prior to the attaching the plurality of semiconductor devices.

12. The method of claim 9, wherein the plating is performed after the encapsulating.

13. The method of claim 9, wherein the encapsulating the plurality of semiconductor devices comprises encapsulating the plurality of devices with a continuous encapsulant that covers all of the plurality of devices.

14. The method of claim 9, wherein the attaching the plurality of semiconductor devices comprises forming wire bond connections between the plurality of semiconductor devices and corresponding leads of the lead frame array.

15. A semiconductor device package, comprising:
a semiconductor die;
a lead electrically coupled to the semiconductor die; and
an encapsulant over the semiconductor die and the lead, wherein the lead has a first surface exposed on a major surface of the encapsulant and a second surface exposed on a side surface of the encapsulant, the lead including a third surface that is an opposite surface to the first surface, wherein the second surface is flush with at least a portion of the side surface, wherein the at least a portion of the side surface is perpendicular to the major surface, wherein the lead comprises an opening from the first surface to the third surface of the lead that opens towards the second surface of the lead and the opening includes solder, wherein the solder has a surface flush with the second surface of the lead across the second surface of the lead in a direction that is parallel to both the first surface and the second surface.

16. The semiconductor device package of claim 15, wherein only the first surface and the second surface of the lead are exposed.

17. The semiconductor device package of claim 15, wherein the lead further comprises a plated conductive layer.

18. The semiconductor device package of claim 15, further comprising a die flag, wherein the semiconductor die is attached to a first major surface of the die flag and the encapsulant exposes a second major surface of the die flag, the second major surface of the die flag opposite the first major surface of the die flag.

19. The semiconductor device package of claim 15, wherein the opening opens out towards the second surface and the first surface of the lead.

20. The semiconductor device package of claim 15, wherein the first surface of the lead is flush with the major surface of the encapsulant.

* * * * *